(12) United States Patent
Fan

(10) Patent No.: US 9,841,627 B2
(45) Date of Patent: Dec. 12, 2017

(54) BACKLIGHT MODULE

(71) Applicant: Shenzhen China Star Optoelectronics Technology Co., Ltd., Shenzhen, Guangdong (CN)

(72) Inventor: Yong Fan, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 91 days.

(21) Appl. No.: 14/890,238

(22) PCT Filed: Sep. 25, 2015

(86) PCT No.: PCT/CN2015/090764
§ 371 (c)(1),
(2) Date: Nov. 10, 2015

(87) PCT Pub. No.: WO2017/049604
PCT Pub. Date: Mar. 30, 2017

(65) Prior Publication Data
US 2017/0184916 A1 Jun. 29, 2017

(51) Int. Cl.
*H01L 29/12* (2006.01)
*G02F 1/1335* (2006.01)
(Continued)

(52) U.S. Cl.
CPC ..... *G02F 1/133603* (2013.01); *G02B 6/0078* (2013.01); *G02F 1/133605* (2013.01);
(Continued)

(58) Field of Classification Search
CPC .. G02B 6/0068; G02B 6/0055; G02B 6/0073; G02B 6/0023; G02B 6/0026;
(Continued)

(56) References Cited

U.S. PATENT DOCUMENTS 8,692,477 B1  4/2014  Lee
2008/0137005 A1*  6/2008  Kim ..................... G02B 6/0055
349/64

(Continued)

FOREIGN PATENT DOCUMENTS

CN           1881039 A       12/2006
CN           1819426 A        2/2007
(Continued)

*Primary Examiner* — Robert Bachner
(74) *Attorney, Agent, or Firm* — Andrew C. Cheng

(57) ABSTRACT

A backlight module includes a substrate having an opening on top, a first reflective plate disposed on a bottom surface of the substrate, light guide plates disposed on the first reflective plate with intervals in between, backlight source components, and a plurality of optical films disposed on the opening of the substrate. The backlight source components comprise heat sink shelves, and point light sources that are fixed on the heat sink shelves and inserted in the interval between two neighboring light guide plates. The present invention effectively reduces the width and thickness of the backlight module, and is instrumental for a narrow-frame and ultra-thin design, effectively reduce production cost. Meanwhile, the arrangement ensures good backlight uniformity, and is instrumental in reducing the distance needed for light mixing. Additionally, the defect of dark band appearing around the backlight module of traditional backlight modules can be effectively eliminated.

16 Claims, 1 Drawing Sheet

(51) Int. Cl.
*H01L 33/06* (2010.01)
*H01L 33/40* (2010.01)
*F21V 8/00* (2006.01)

(52) U.S. Cl.
CPC ............ *H01L 33/06* (2013.01); *H01L 33/405* (2013.01); *G02F 2001/133628* (2013.01)

(58) Field of Classification Search
CPC .. G02B 6/0051; G02B 6/0078; G02B 6/0088; G02B 6/0028; G02B 6/0091; G02B 6/0085; G02B 6/0025; G02B 6/0031; G02B 6/0035
See application file for complete search history.

(56) References Cited

U.S. PATENT DOCUMENTS

| | | | |
|---|---|---|---|
| 2008/0289756 A1* | 11/2008 | Maeda | G02B 26/0825 156/280 |
| 2008/0291519 A1* | 11/2008 | Maeda | G02B 26/06 359/224.1 |
| 2010/0046124 A1 | 2/2010 | Hibi | |
| 2013/0170178 A1* | 7/2013 | Yoo | G02B 6/4298 362/84 |
| 2014/0027673 A1* | 1/2014 | Nick | C09K 11/025 252/301.6 S |
| 2016/0004006 A1* | 1/2016 | Zhu | G02B 6/0078 362/613 |

FOREIGN PATENT DOCUMENTS

| | | |
|---|---|---|
| CN | 1909349 A | 2/2007 |
| CN | 102052607 A | 5/2011 |
| CN | 102200659 A | 9/2011 |
| CN | 103759175 A | 4/2014 |
| CN | 104049559 A | 9/2014 |
| CN | 104566042 A | 4/2015 |
| CN | 104834049 A | 8/2015 |
| CN | 204554502 | 8/2015 |
| WO | WO2015045154 A1 | 4/2015 |

* cited by examiner

BACKLIGHT MODULE

BACKGROUND OF THE INVENTION

1. Field of the Invention

The present invention relates to display technology, and more specifically, to a backlight module.

2. Description of the Prior Art

Given that a traditional thin-film transistor liquid crystal display (TFT-LCD) panel does not emit light, an external light source must be added for the panel to display. This kind of external light source is usually a backlight source or reflective light source. The light emitted from a backlight source is little influenced by changes of environmental factors, therefore most of the TFT-LCDs nowadays apply backlight source.

The backlight source of TFT-LCD has evolved from cold cathode fluorescent lamp (CCFL) to light-emitting diode (LED). Because LED has many advantages, including small size, quick reaction, long lifespan, not being fragile, high color gamut and multiple packaging bodies, it has become the mainstream in backlight source.

LED backlight can generally be divided into edge-lit LED and direct-lit LED. The edge-lit LED consumes lower energy and is thinner, but must be used with a light guide plate, rendering it heavier and of higher production cost. On the other hand, the direct-lit LED uses less light sources (with prism) and does not need a light guide plate, therefore the cost is lower, but it looks thicker as the lightbox is relatively higher.

The spectrum of light emitted by quantum dot (QD) fluorescent powder has a narrow full width at half maximum (FWHW), ranging from 20 a to 40 nm, so its color purity is extremely high, the highest among all existing fluorescent powders to realize color purity. However, because QD fluorescent powder is synthesized through chemical solution, it is difficult to distribute evenly along with silica gel. In addition, it is water-sensitive and oxygen-sensitive, and the light emitted from it can be seriously affected by thermal quenching. If it is directly packaged in the LED, it would have low luminance and reliability, and cannot be put into mass production. Currently, a viable solution to mass-produce QD fluorescent powder is remote fluorescent powder, the most noticeable one being 3M's quantum dot enhancement film (QDEF). The product has a layered structure and QD is packaged in optical films, which will be applied with other optical films. Another representative product is QD Vision's QD tube, which packages QD powder in a glass tube. When applied, the QD tube is put in front of the LED and fixed by supportive structures. However, presently the application of the QD film to ultra-large products is limited as QD films cannot be larger than 100 inch in width due to the size limit of entities. Meanwhile, the QD tube can only be applied to edge-lit LEDs as it is difficult to assemble bended glass tubes, which are extremely fragile. In addition, the size of the light guide plate, due to limits of current technology, cannot be larger than 98 inch. Given these various reasons, it is difficult to apply QD technology on ultra-large products with regular optical design approaches.

SUMMARY OF THE INVENTION

Given the insufficiency of the existing technology, the present invention provides a backlight module that is low in production cost and easy to realize.

According to the present invention, a backlight module comprises a substrate having an opening on top, a first reflective plate disposed on a bottom surface of the substrate, a plurality of light guide plates disposed on the first reflective plate with intervals in between, backlight source components, and a plurality of optical films disposed on the opening of the substrate. The backlight source components comprise heat sink shelves, and point light sources that are fixed on the heat sink shelves and inserted in the interval between two neighboring light guide plates.

Furthermore, the heat sink shelf comprises a horizontal part and a vertical part that are perpendicular to each other. The point light sources are fixed on the vertical part which goes through the first reflective plate and inserts in the interval between two neighboring light guide plates. The horizontal part is sandwiched between the first reflective plate and the bottom surface of the substrate.

Furthermore, the point light sources are a plurality of light-emitting diodes (LEDs) disposed circularly on the heat sink shelves.

Furthermore, the point light sources are quantum tubes.

Furthermore, the backlight module further comprises a diffuser plate which is disposed between the set of optical films and the substrate.

Furthermore, the backlight module further comprises supporting pillars disposed on the light guide plate to support the diffuser plate.

Furthermore, the backlight module further comprises dot diffusion films sticking on and covering the interval between any two neighboring light guide plates.

Furthermore, walls of the substrate comprise a first part that is neighboring to the bottom surface of the substrate, and a second part that extends from the first part and folds outward as it goes upward. A second reflective plate is adhered to the internal surface of both the first part and the second part.

Furthermore, the angle between the first part with the second reflective plate adhering to it and the bottom surface of the substrate is no larger than 90°.

Furthermore, the height from the bottom surface of the substrate to the top of the first part with the second reflective plate adhering to it is larger than the thickness of the light guide plate.

In contrast to prior art, a first reflective film on the bottom surface of the substrate of the backlight module of the present invention is installed with a plurality of light guide plates, with intervals in between. Point light sources are installed in the interval between two neighboring light guide plates, greatly reducing the width and thickness of the backlight module, so that the backlight module can be better applied to large-scale display devices. If the backlight module is combined with QD technology, the QD technology can be applied to ultra-large panels and effectively reduce the number of point light sources, thus lower the production cost. Meanwhile, a dot diffusion film is installed above the point light source, and a diffuser plate is stuck to the back of the optical film set. The arrangement ensures good backlight uniformity, and is instrumental in reducing the distance needed for light mixing. Reflective plates are adhered to the substrate and the walls neighboring to the substrate's bottom surface. With sensible design in height and tilting angle of these reflective plates, the defect of dark/bright band appearing around the backlight module of traditional backlight modules can be effectively eliminated.

DETAILED DESCRIPTION OF THE PREFERRED EMBODIMENTS

For better understanding embodiments of the present invention, the following detailed description taken in conjunction with the accompanying drawings is provided. Apparently, the accompanying drawings are merely for some of the embodiments of the present invention. Any ordinarily skilled person in the technical field of the present invention could still obtain other accompanying drawings without use laborious invention based on the present accompanying drawings.

Figure 1:
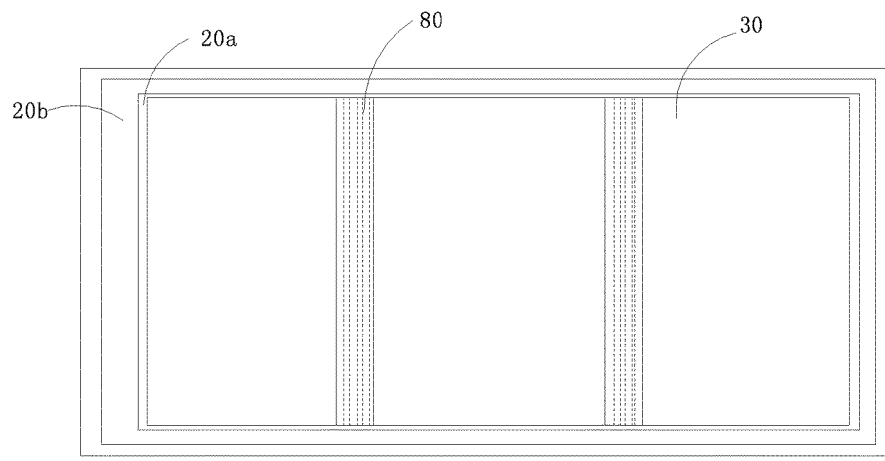
FIG. 1 shows schematic diagram of a backlight module according to a preferred embodiment of the present invention.
Figure 2:
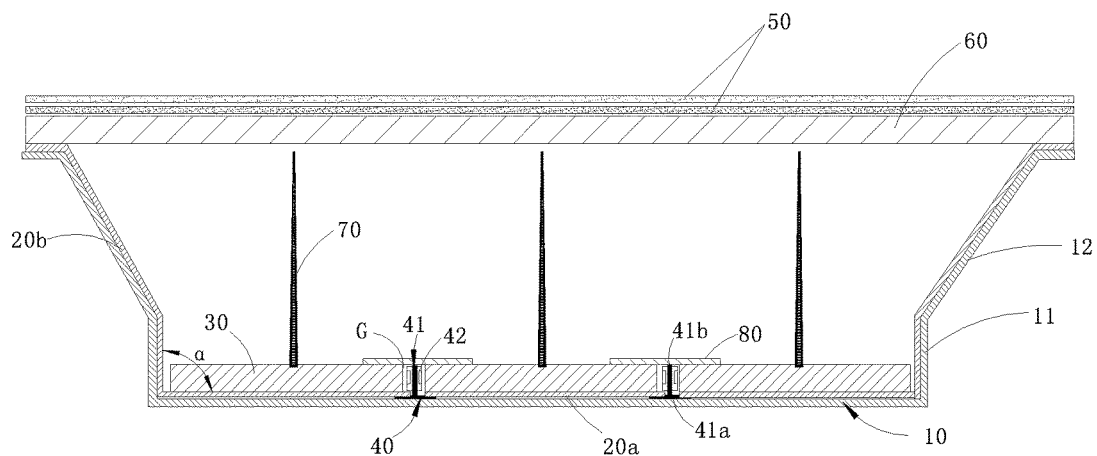
FIG. 2 is a cross-sectional view of the backlight module according to a preferred embodiment of the present invention.

Please refer to FIG. 1 and FIG. 2. The backlight module of the present invention comprises a substrate 10 having an opening on top, a first reflective plate 20a installed on the bottom surface of the substrate 10, a plurality of light guide plates 30 with an interval in between any two plates on the first reflective plate 20a, backlight source component 40 and a set of optical films 50 installed on the open on top of the substrate 10. The backlight source component 40 comprises heat sink shelves 41 and point light sources 42 fixed on the heat sink shelves 41. The point light source 42 is inserted in the interval G between two neighboring light guide plates 30.

The point light sources 42 of the backlight source component 40 are deployed in rows in the interval G between any two neighboring light guide plates 30. The heat sink shelf 41, specifically, has a T-shape structure, comprising a horizontal part 41a and a vertical part 41b that are perpendicular to each other. The point light source 42 is fixed on the vertical part 41b. The vertical part 41b goes through the first reflective plate 20a and is inserted into the interval G between two neighboring light guide plates 30. The horizontal part 41a is sandwiched between the first reflective plate 20a and the bottom surface of the substrate 10. The point light sources 42 are a plurality of LEDs fixed circularly, or a quantum tube formed, on the vertical part 41b of the heat sink shelf 41. The light emitted from the point light sources 42, perpendicular to the vertical part 41b, beams to every direction in a 360-degree circle, and into the light guide plate 30 evenly. The heat sink shelf 41 of the present embodiment is structured in one piece, meaning that it only comprises one horizontal part 41a, on which a plurality of vertical parts 41b is fixed. In other embodiments, the heat sink shelf 41 can be a plurality of independent entities. Each heat sink shelf 41 only comprises one horizontal part 41a and one vertical part 41b.

A diffuser plate 60, installed on the open of the substrate 10, sticks to the back of the set of optical films 50. The upper surface of the light guide plate 30 is fixed with a plurality of supporting pillars 70 installed with intervals in between. The supporting pillars 70, perpendicular to the light guide plate 30, extend to the open of the substrate 10, with their tips isolated from the diffuser plate 60 by a fixed space. The supporting pillars are used to support the diffuser plate 60 to prevent it from deforming.

In addition, given that luminance tend to be brighter and the edge of the light-incoming surface tend to be thicker around the area where two light guide plates 30 meet, the present embodiment adheres a dot diffusion film 80 between two neighboring light guide plates 30. The dot diffusion film 80 is installed with a plurality of scattering netted dots, meant to attain to scattering effect, on its surface, and is disposed above the point light source 42, covering the interval G. The light emitted from the top of the point light source 42, after homogenized by the dot diffusion film 80, can beam evenly to ensure that the luminance around the interval G between light guide plates 30 is not too high to affect backlit effects and thus reduces the distance needed for light mixing (that is, the distance between light guide plates 30 and the diffuser plate 60).

When the distance needed for light mixing is reduced to a certain extent, e.g. smaller than 20 mm, dark/bright bands may appear around the backlight module. In order to improve the optical quality, the walls of the substrate 10 of the present embodiment are formed into a first part 11 neighboring the bottom surface of the substrate 10 and a second part 12 that extends from the first part and folds outward as it goes upward in the shape of a loudspeaker. The inner surface of the first part 11 and the second part 12 is adhered with a second reflective plate 20b. In one of the embodiments, the second reflective plate 20b is in the same shape as the walls of the substrate 10. An angle α between the first part 11 which is adhered with the second reflective plate 20b and the bottom surface of the substrate 10 is no larger than 90°. In addition, the height from the bottom surface of the substrate 10 to the top of the first part 11 which is adhered with the second reflective plate 20b is larger than the thickness of the light guide plate 30. A distance is kept between the first part 11 which is adhered with the second reflective plate 20b and the light guide plate 30. Specifically, the height from the bottom surface of the substrate 10 to the top of the first part 11 which is adhered with the second reflective plate 20b should be at least 2 mm higher than the thickness of the light guide plate 30. With such an arrangement, when the light goes from the light guide plate 30 to the first part 11 which is adhered with the second reflective plate 20b, it will not beam to the light-outgoing surface, thus the problem of a dark/bright band appearing around the backlight module of traditional reflective plates is avoided.

The present invention effectively reduces the width and thickness of the backlight module, and is instrumental for a narrow-frame and ultra-thin design, thus the backlight module can be better applied to large-size display devices. When it is combined with QD technology, it can further help apply QD technology on ultra-large devices, and effectively reduce the number of point light sources and production cost. Meanwhile, a dot diffusion film is installed above the point light source, and a diffuser plate is stuck to the back of the set of optical films. The arrangement ensures good backlight uniformity, and is instrumental in reducing the distance needed for light mixing. Reflective plates are adhered to the substrate and the walls neighboring to the substrate's bottom surface. With sensible design in height and tilting angle of these reflective plates, the defect of dark/bright band appearing around the backlight module of traditional backlight modules can be effectively eliminated.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. A backlight module, comprising:
  a substrate having an opening on top;
  a first reflective plate, disposed on a bottom surface of the substrate;
  a plurality of light guide plates, disposed on the first reflective plate with intervals in between;
  backlight source components comprising heat sink shelves, and point light sources that are fixed on the heat sink shelves and inserted in the interval between two neighboring light guide plates; and a plurality of optical films disposed on the opening of the substrate, wherein walls of the substrate comprise a first part that is neighboring to the bottom surface of the substrate, and a second part that extends from the first part and folds outward as it goes upward; a second reflective plate is adhered to the internal surface of both the first part and the second part.

2. The backlight module of claim 1, wherein the heat sink shelf comprises a horizontal part and a vertical part that are perpendicular to each other;

the point light sources are fixed on the vertical part which goes through the first reflective plate and inserts in the interval between two neighboring light guide plates;

the horizontal part is sandwiched between the first reflective plate and the bottom surface of the substrate.

3. The backlight module of claim 1, wherein the point light sources are a plurality of light-emitting diodes (LEDs) disposed circularly on the heat sink shelves.

4. The backlight module of claim 1, wherein the point light sources are quantum tubes.

5. The backlight module of claim 1, further comprising a diffuser plate, which is disposed between the set of optical films and the substrate.

6. The backlight module of claim 5, further comprising supporting pillars disposed on the light guide plate to support the diffuser plate.

7. The backlight module of claim 1, further comprising dot diffusion films sticking on and covering the interval between any two neighboring light guide plates.

8. The backlight module of claim 1, wherein the angle between the first part with the second reflective plate adhering to it and the bottom surface of the substrate is no larger than 90°.

9. The backlight module of claim 1, wherein the height from the bottom surface of the substrate to the top of the first part with the second reflective plate adhering to it is larger than the thickness of the light guide plate.

10. The backlight module of claim 2, wherein the angle between the first part with the second reflective plate adhering to it and the bottom surface of the substrate is no larger than 90°.

11. The backlight module of claim 2, wherein the height from the bottom surface of the substrate to the top of the first part with the second reflective plate adhering to it is larger than the thickness of the light guide plate.

12. The backlight module of claim 5, wherein the angle between the first part with the second reflective plate adhering to it and the bottom surface of the substrate is no larger than 90°.

13. The backlight module of claim 5, wherein the height from the bottom surface of the substrate to the top of the first part with the second reflective plate adhering to it is larger than the thickness of the light guide plate.

14. The backlight module of claim 6, wherein the angle between the first part with the second reflective plate adhering to it and the bottom surface of the substrate is no larger than 90°.

15. The backlight module of claim 6, wherein the height from the bottom surface of the substrate to the top of the first part with the second reflective plate adhering to it is larger than the thickness of the light guide plate.

16. A backlight module, comprising:

a substrate having an opening on top;

a first reflective plate, disposed on a bottom surface of the substrate;

a plurality of light guide plates, disposed on the first reflective plate with intervals in between;

backlight source components comprising heat sink shelves, and point light sources that are fixed on the heat sink shelves and inserted in the interval between two neighboring light guide plates;

a plurality of optical films disposed on the opening of the substrate; and dot diffusion films, sticking on and covering the interval between any two neighboring light guide plates, wherein walls of the substrate comprise a first part that is neighboring to the bottom surface of the substrate, and a second part that extends from the first part and folds outward as it goes upward; a second reflective plate is adhered to the internal surface of both the first part and the second part.

* * * * *